(12) United States Patent
Nishihara et al.

(10) Patent No.: US 6,413,439 B1
(45) Date of Patent: Jul. 2, 2002

(54) METHOD OF MANUFACTURING SURFACE ACOUSTIC WAVE DEVICE

(75) Inventors: Tokihiro Nishihara; Osamu Ikata; Yoshio Satoh, all of Kawasaki (JP)

(73) Assignees: Fujitsu Limited, Kawasaki; Fujitsu Media Devices Limited, Nagano, both of (JP)

( * ) Notice: Subject to any disclaimer, the term of this patent is extended or adjusted under 35 U.S.C. 154(b) by 0 days.

(21) Appl. No.: 09/437,832

(22) Filed: Nov. 10, 1999

(30) Foreign Application Priority Data

Mar. 18, 1999 (JP) ............................................ 11-073844

(51) Int. Cl.[7] .............................................. H01L 41/08
(52) U.S. Cl. ...................................................... 216/77
(58) Field of Search ............................. 156/345; 216/77

(56) References Cited

U.S. PATENT DOCUMENTS 5,144,185 A * 9/1992 Yuhara et al. .......... 310/313 B
5,667,630 A * 9/1997 Lo ............................. 438/653
5,976,986 A * 11/1999 Naeem et al. .............. 438/714

FOREIGN PATENT DOCUMENTS

| JP | 61-147532 | | 7/1986 |
| JP | 6-333883 | | 12/1994 |
| JP | 07-074572 | * | 3/1995 |
| JP | 7-122961 | | 5/1995 |
| JP | 8-264508 | | 10/1996 |
| JP | 09/181553 | * | 7/1997 |
| JP | 10-135767 | | 5/1998 |

* cited by examiner

Primary Examiner—Thi Dang
(74) Attorney, Agent, or Firm—Armstrong, Westerman & Hattori, LLP

(57) ABSTRACT

A method of manufacturing a surface acoustic device having an electrode containing an Al and an other metal comprising; forming patterning a layer of an Al and other metal forming the electrode by reactive ion etching which is conducted by using an etching gas containing a mixed gas comprising $Cl_2$ and He at a gas pressure of 0.1 Pa to 3 Pa.

11 Claims, 6 Drawing Sheets

1: -1.3965dB
1.969GHz
2: -1.5684dB
1.995GHz
3: -2.8965dB
1.914GHz
4: -2.8965dB
1.995GHz

METHOD OF MANUFACTURING SURFACE ACOUSTIC WAVE DEVICE

CROSS-REFERENCE TO RELATED APPLICATION

This application is related to Japanese application No. HEI 11 (1999)-73844 filed on Mar. 18, 1999, whose priority is claimed under 35 USC §119, the disclosure of which is incorporated by reference in its entirety.

BACKGROUND OF THE INVENTION

1. Field of the Invention

The present invention relates to a method of manufacturing a surface acoustic wave (SAW) device. More particularly, the present invention relates to a method of reliably forming the electrode of the SAW device having a high-power durability by a reactive ion etching method.

2. Description of the Related Arts

If high power voltage is applied to an electrode constituting the SAW device, migration produces in the electrode to degrade a filter characteristic. As a countermeasure against this, it has been known that a laminated body including an Al alloy or an Al layer can be used so as to improve the high-power durability (for example, see Japanese Unexamined Patent Publication No. HEI 7 (1995)-122961, Japanese Unexamined Patent Publication No. HEI 10 (1998)-135767). This electrode is usually formed by dry etching such as reactive ion etching. A mixed gas comprising halogen such as $BCl_3$ and $Cl_2$ is generally used for the etching (for example, see Japanese Unexamined Patent Publication No. HEI 8 (1996)-264508, Japanese Unexamined Patent Publication No. HEI 9 (1997)-181553).

When an electrode containing a substance such as Ti, Pd, Si, or the like, whose halide has a high vapor pressure, in addition to Al, is subjected to the dry etching, the electrode can be etched without leaving residues. However, when an electrode containing a metal such as Cu, Mg, or the like, whose halide has a low vapor pressure, is subjected to the dry etching, there is a problem that the halide remains as a residue to induce aftercorrosion, and in particular, when the electrode contains a high concentration not less than 2 wt% of these metals, there is a problem that the etching itself does not proceed.

Further, a piezoelectric substrate made of $LiNbO_3$, $LiTaO_3$, $Li_2B_4O_7$, or the like is used for the SAW device and there is also a problem that a compound of halogen contained in a gas used for etching and lithium derived from the piezoelectric substrate also remain as residues and further increase the generation of the aftercorrosion.

Although it is thinkable that the etching rate of a layer containing the metal whose halide has a low vapor pressure and Al is increased, while reducing residues, by physical etching such as sputtering with a rare gas, the physical etching produces a problem that a side wall is reversely tapered in the direction of thickness. Further, etching is continuously performed for a long time (over-etching) so as to remove residues yet to be etched, and this produces a problem that the physical etching is poor in selectivity and hence etches also the piezoelectric substrate to degrade the characteristics of the SAW device.

A method of etching a layer containing Al with a mixed gas comprising a gas containing halogen and He is disclosed by Japanese Unexamined Patent Publication No. SHO 61 (1986)-147532, although it does not refer to the SAW device. He is used there at a high flow of 800 sccm or more so as to have an effect on cooling the layer and to stabilize plasma. However, there is a problem that if the He is used at such a high flow, a gas pressure can not be reduced and hence a selectivity to an electrode and to a resist used as a mask for the etching can not be increased.

A method of etching a layer containing Al with a mixed gas comprising $Cl_2$ and He by ECR etching, instead of a reactive ion etching, is disclosed in Japanese Unexamined Patent Publication No. HEI 6 (1994)-333883.

The ECR etching has a problem that, when compared with the reactive ion etching, its apparatus is expensive and needs an ultra-high vacuum exhaust and hence reduces throughput. Further, the ECR etching has a problem that, because low pressure high density plasma is used in the ECR etching, in principle, an electron density is higher in the ECR etching than in the reactive ion etching by two to three orders, and hence the SAW device using the piezoelectric substrate is charged and produces defects derived therefrom.

SUMMARY OF THE INVENTION

It has been considered that since the reactive ion etching has higher incident ion energy than the ECR etching, it is poor in selectivity and hence tends to cause damage to a piezoelectric substrate which is an underlayer. However, the present inventors have unexpectedly discovered that an electrode containing the metal whose halide has a low vapor pressure and Al can be formed with a practical selectivity by etching under a gas pressure of 0.1 Pa to 3 Pa with an etching gas containing a mixed gas comprising $Cl_2$ and He, and have made the present invention.

The present invention provides a method of manufacturing a SAW device having an electrode containing Al and the other metal, comprising; patterning a layer of an Al and other metal forming the electrode by reactive ion etching which is conducted by using an etching gas containing a mixed gas comprising $Cl_2$ and He under a gas pressure of 0.1 Pa to 3 Pa.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
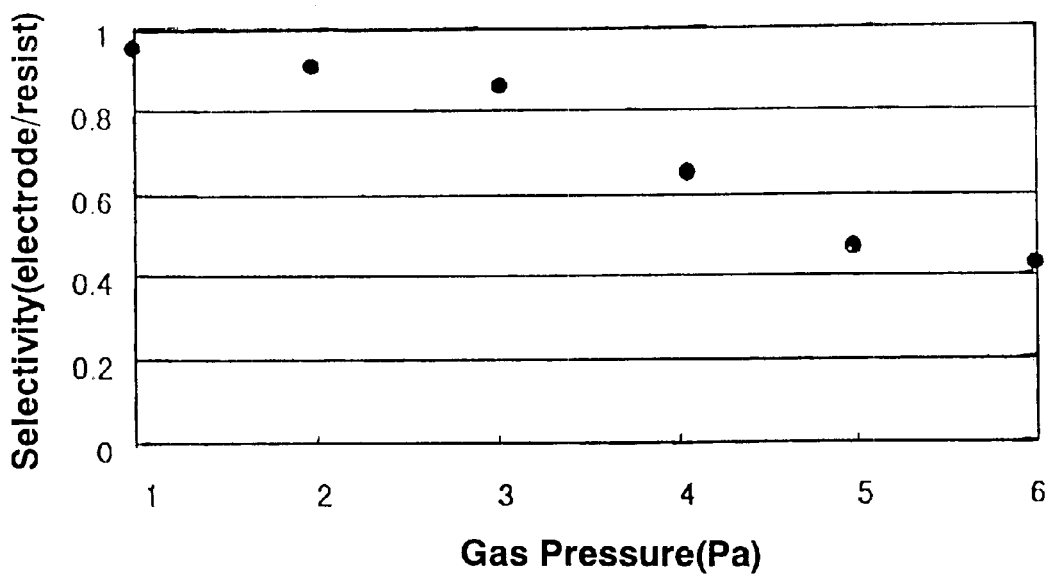
FIG. 1 is a graph showing a relationship between the gas pressure and the selectivity of the present invention.

A method of manufacturing a surface acoustic wave (SAW) device in accordance with the present invention will hereinafter be described.

First, the SAW device usually has an electrode having a predetermined shape on a substrate. Here, the substrate is not specifically limited as long as it can be used as the SAW device, but, for example, a piezoelectric substrate made of single crystal such as $LiNbO_3$, $LiTaO_3$, $Li_2B_4O_7$, or the like may be used as the substrate.

Next, the electrode having a predetermined shape is formed on a piezoelectric substrate. In the present invention, the electrode contains Al and other metal. In this regard, when the other metal is a substance such as Mg, Cu, Mn, or the like, whose halide has a low vapor pressure, the method of manufacturing the SAW in accordance with the present invention has a merit that, in particular, it can prevent the generation of residue or aftercorrosion. Among the other metal, Mg is particularly suitable.

Also, the content of the other metal in the electrode is preferably 1 weight % or more, and more preferably, 1 to 30 weight %. The amount of less than 1 weight % is not preferable because the resistance to migration is reduced. In this respect, it is well known that if the content of the other metal is increased, power durability is improved in general but the resistance of the electrode is increased. From this point of view, it is particularly desirable that the content of the other metal is 2 to 10 weight %.

Further, as the constitution of the electrode, there is provided, for example, a single layer made of an alloy comprising Al and the other metal, a laminated body of an Al layer and an other metal layer, a laminated body of an Al layer and an alloy layer, and a laminated body of an alloy layer in which the content of the other metal is changed. The number of layers of the laminated body is not limited, as long as it is two or more. However, the uppermost layer is preferably made of a layer containing Al in view of an affinity with a bonding wire metal. In particular, it is preferable that the laminated body is a combination of an Al layer or Al alloy layer/an Mg layer/an Al layer or Al alloy layer.

The thickness of the electrode is suitably set according to the design of the SAW device, on the basis of the weight thereof, in consideration of the resistance of the electrode, the resistance to migration of the electrode, and the like.

The above electrode is formed by laminating a metal layer for forming an electrode on a substrate and then by patterning it by a reactive ion etching.

The method of forming the metal layer is not particularly limited, but, for example, any well-known method such as a sputtering method may be used.

Next, before patterning by the reactive ion etching, a mask for forming an electrode having a predetermined pattern is usually formed on the metal layer. This mask can be formed, for example, by applying a resist layer on the metal layer and then by patterning the resist layer it into a predetermined shape by a photolithography method. The resist layer patterned into the predetermined shape is hereinafter referred to as resist pattern.

Next, the electrode is formed by patterning the metal layer by the reactive ion etching using the resist pattern as a mask.

In this regard, one of the features of the present invention is that the reactive ion etching is performed by using an etching gas made of a mixed gas comprising $Cl_2$ and He at a gas pressure of 0.1 to 3 Pa.

In general, in the dry etching of an Al alloy, a $Cl_2$ gas is used for the purpose of increasing an etching rate of the Al alloy, and in order to remove a natural oxide film, a reducing gas such as $BCl_3$, $CCl_4$, $SiCl_4$, or the like is added thereto. Also, the reducing gas containing halogen added to the $Cl_2$ gas becomes a constituent of a side wall protection film and plays an important role in preventing side etching.

However, when the Al electrode contains the other metal whose halide has a low vapor pressure, a residue is produced or etching itself does not proceed. This is because even if chlorine radical is deposited on the surface of the electrode, reaction does not proceed owing to high activation energy, which is different from a pure Al electrode.

Therefore, in the present invention, because He is used and hence a mean free path can be made large owing to the small atomic radius of He, He can enters into the substrate vertically and hence can reduce activation energy. Here, the mean free path λ is expressed by a formula $\lambda = 3.11 \times 10^{-24} \times T/(P \times \sigma^2)$, where T is a temperature (K), P is a gas pressure (Pa), and σ is a particle diameter (m). Here, the gas pressure within the range described above can prevent the scattering of He and can increase the mean free path to a predetermined extent. In this connection, in the above-mentioned Japanese Unexamined Patent Publication No. SHO 61 (1986)-147532, because the flow of He is large, the gas pressure is high and hence the mean free path can not be increased.

Further, when the gas pressure is more than 3 Pa, the mean free path decreases and the scattering of the He increases. On the other hand, when the gas pressure is less than 0.1 Pa, it is difficult to obtain a stable plasma discharge. If the gas pressure is within the above range, as shown in FIG. 1, the selectivity to the electrode and the resist can be improved. In this connection, a laminated film comprising Al (2000 Å)/Mg (300 Å)/Al (2000 Å) was used as the electrode.

Figure 2:
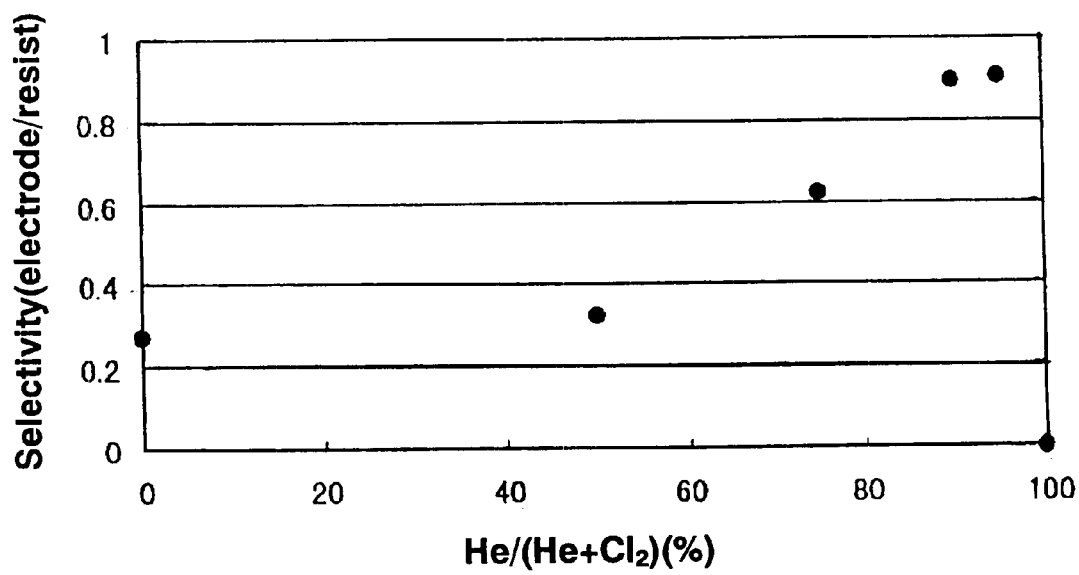
FIG. 2 is a graph showing a relationship between the mixing ratio of He in the mixed gas and the selectivity of the present invention.

The mixing ratio of He is preferably not less than 70% in terms of a flow ratio, more preferably, 80% to 98%. Also, the total flow of the mixed gas is about 10 to 100 sccm. By making the flow ratio not less than 70%, the mean free path can be increased; the occurrence of nonvolatile halide of lithium which is derived from the substrate can be prevented because only a required amount of $Cl_2$ is used; the generation of aftercorrosion can be prevented; and as shown in FIG. 2, the selectivity to the electrode and the resist can be improved. According to the present invention, the natural oxide film can be removed at a practical etching rate under the above etching conditions. Further, since the activation energy of the reaction of the metal used for the electrode including the natural oxide film and the chlorine radical is smaller than the activation energy of the substrate and the chlorine radical, the selectivity to the substrate and the electrode can sufficiently be ensured.

The RF power of the reactive ion etching is preferably 30 to 120 w. The RF power less than 30 w is not preferable because the practical etching rate and the selectivity can not be obtained and the RF power more than 120 w is not preferable because the resist and the substrate sustain damage.

Here, when the electrode is made of a laminated body of the layer of Al or Al alloy and the other metal (in particular, Mg) layer, there is a case where the etching rate deteriorates in the other metal layer. In this case, it can be that prevent the deterioration of etching rate by annealing the metal layer at 100 to 300° C., because the other metal is diffused in Al and the electrode becomes a solid solution.

Also, there has been in recent years a tendency to make the frequency of the SAW device higher and to make the pattern of the electrode finer. As the frequency of the SAW device is made higher, the wavelength of a surface acoustic wave is made shorter and the SAW device becomes sensitive to the damaged surface of the piezoelectric substrate, and, for example, increases device loss when it is dry-etched (in particular, over-etched). Hence, if the reactive ion etching process is divided into two etching steps and the RF power is lowered and/or the gas pressure is increased during the latter etching step, the damage of the surface of the piezoelectric substrate can be reduced. The etching time of the latter etching step is preferably 10 to 40% of the total etching time. Here, the latter etching is preferably over-etching.

As for the extent of lowering the RF power, the RF power in the latter etching step is preferably not less than 50% to less than 100%, and more preferably, 60 to 95%, of the RF POWER in the former step.

As for the extent of increasing the gas pressure, the gas pressure in the latter etching step is preferably about 1.5 to 3 times, and more preferably, 2 to 3 times the former gas pressure.

Figure 3:
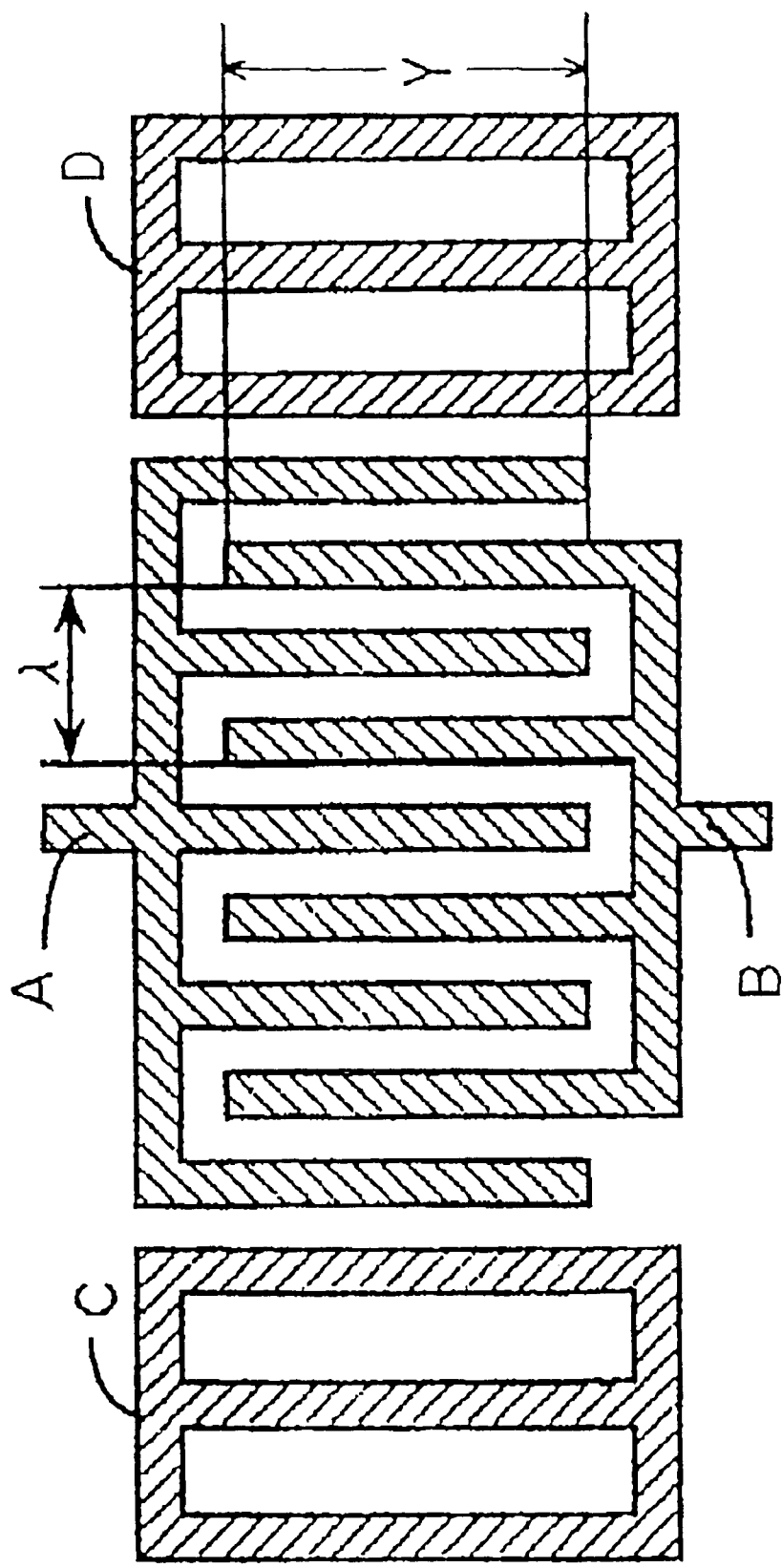
FIG. 3 is a schematic plan view of a SAW device.

In general, the SAW device manufactured in accordance with the present invention includes two reflection electrodes and a pair of comb-shaped excitation electrodes. On example of the SAW-device is shown in FIG. 3. FIG. 3 is a schematic plan view of the SAW device. In the drawing, A and B designate a pair of comb-shaped excitation electrodes, and C and D designate the reflection electrodes. Y designates an aperture length and λ designates the period of the electrode. In this connection, the constitution shown in FIG. 3 is only an example and it is not intended to limit the SAW device formed in accordance with the present invention to this constitution.

This SAW device can be applied to a filter, a resonator, a delay line, an oscillator, a matched filter, an acousto-optical device, a convolver, and the like. For example, when it is used for the filter, a ladder-type structure is an example in which a desired number of SAW devices are arranged at a series arm and a parallel arm. In addition to this structure, the SAW can be applied to any well-known structure.

(Embodiment)

Next, specific preferred embodiments in accordance with the present invention will be described by followed example, but it is not intended to limit the present invention to these examples.

EXAMPLE 1

An Al layer having a thickness of 400 nm, an Al alloy layer containing 2 weight % Mg (hereinafter referred to as Al—2% Mg alloy layer, used in the same sense in the following), and an Al—4% Mg alloy were formed on a piezoelectric substrate made of a single crystal of LiTaO$_3$, respectively, and a resist pattern for forming a comb-shaped electrode of 1.2 μm rule was formed on the Al layer and the alloy layer by a photolithography method. Then, the layers were dry-etched by the reactive ion etching using the resist pattern as a mask under the following conditions:

Etching conditions:

Etching gas; mixed gas comprising Cl$_2$ and He (flow ratio =1:9)

Gas pressure; 1 Pa

RF power; 70 w

After etching, the resist pattern was ashed by O$_2$ in an asher chamber and then the layers were subjected to post etching by SF$_6$ as a countermeasure against aftercorrosion, solution processing, and washing by water.

An electrode could be formed to the same degree of sharpness on both the Al—2% Mg alloy layer and the Al-4% alloy layer as on the Al alloy. In this connection, the selective ratio of the resist to the Al alloy layer, the Al—2% Mg alloy layer, and the Al-4% alloy layer are 1.9, 1.5, and 1.2, respectively.

EXAMPLE 2

Figure 4A:
FIG. 4A to FIG. 4E are a schematic cross-sectional view method of manufacturing SAW device of the example 2 of the present invention.
Figure 4B:
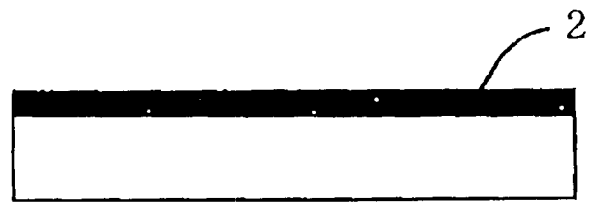
Figure 4C:
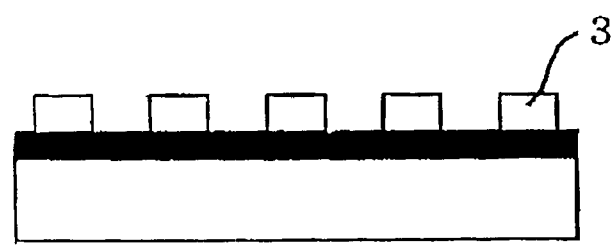
Figure 4D:
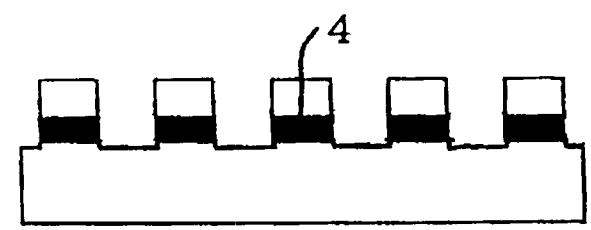

An Al—3% Cu alloy layer 2 having a thickness of 430 nm was formed on a piezoelectric substrate 1 (see FIG. 4A) made of a single crystal of 36° Y cut-X propagation LiTaO$_3$ by a sputtering method (see FIG. 4B), and then a resist pattern 3 for forming the comb-shaped electrode of a 800 MHz band filter was formed on the larger 2 (see FIG. 4C). Then, the alloy layer 2 was dry-etched by the reactive ion etching using the resist pattern 3 as a mask, while varying the over-etching time under the following conditions, to form an electrode 4 (see FIG. 4D).

Etching conditions:

Etching gas; mixed gas comprising Cl$_2$ and He (flow ratio =0.5:9.5)

Gas pressure; 2 Pa

RF power; 60 w

Figure 4E:

After etching, the resist pattern was ashed by O$_2$ in an asher chamber (see FIG. 4E), and then the electrode 4 was subjected to post etching by SF$_6$ for a countermeasure against the aftercorrosion, solution processing, and washing by water.

Figure 5:
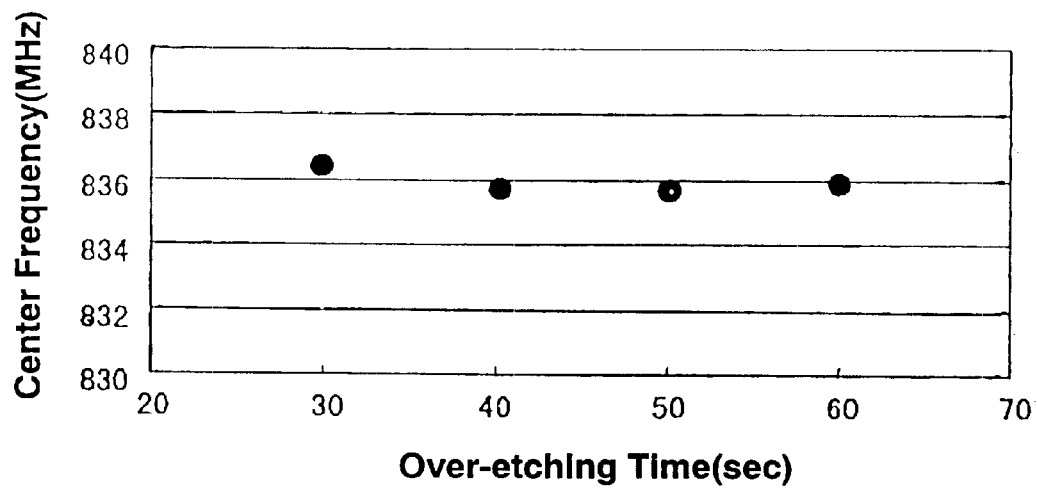
FIG. 5 is a graph showing a relationship between the over-etching time and the center frequency of SAW device of the example 2 of the present invention.
Figure 6:
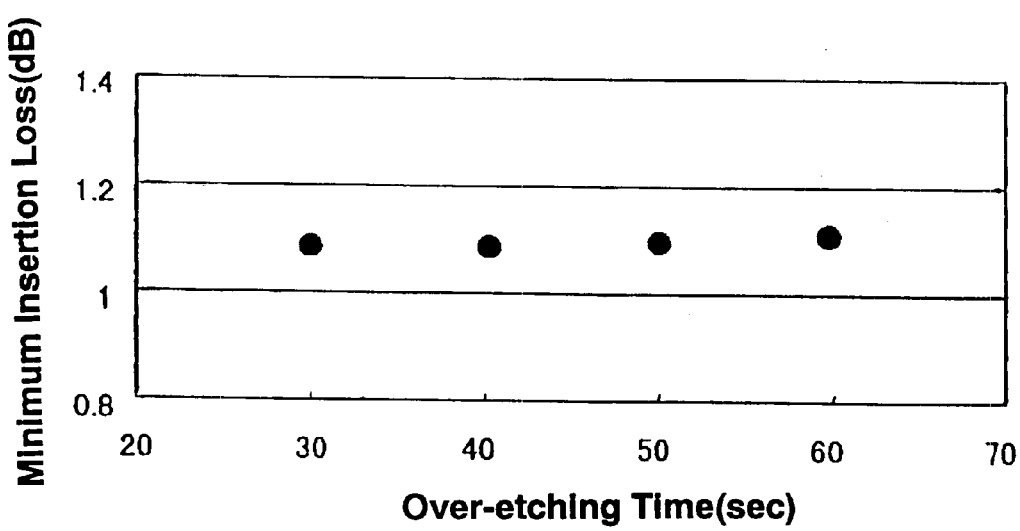
FIG. 6 is a graph showing a relationship between the over-etching time and the minimum insertion loss of SAW device of the example 2 of the present invention.

The relationship between the over-etching time and the center frequency or the minimum insertion loss of the obtained filter will be shown in FIG. 5 and FIG. 6. As is evident from the drawings, even if the over-etching time was varied, the variations of the center frequency and the minimum insertion loss could be reduced to a small degree. This shows that the damage to the piezoelectric substrate by above etching conditions causes an insignificant level.

EXAMPLE 3

A 1920 to 1980 MHz band filter was manufactured by the following procedures. A laminated body of an Al layer (850 Å), a Mg layer (140 Å), and an Al layer (850 Å) from the bottom was formed on a piezoelectric substrate made of a single crystal of 36° Y cut-X propagation LiTaO$_3$ by the sputtering method. After it was formed, it was annealed in a vacuum at 200° C. for 1 hour.

Then, a resist pattern of a predetermined shape was formed on the laminated body by the photolithography method. Then, the above laminated body was dry-etched by the reactive ion etching using the resist pattern as a mask under the following conditions.

Etching conditions:

Etching gas; mixed gas comprising Cl$_2$ and He (flow ratio =1:9)

Gas pressure; 1 Pa

RF power; 70 w at start, and lowered to 50 W during over-etching.

After etching, the resist pattern was ashed by $O_2$ in an asher chamber, and then the laminated body was subjected to post etching by $SF_6$ for a countermeasure against the aftercorrosion, solution processing, and washing by water.

Figure 7:
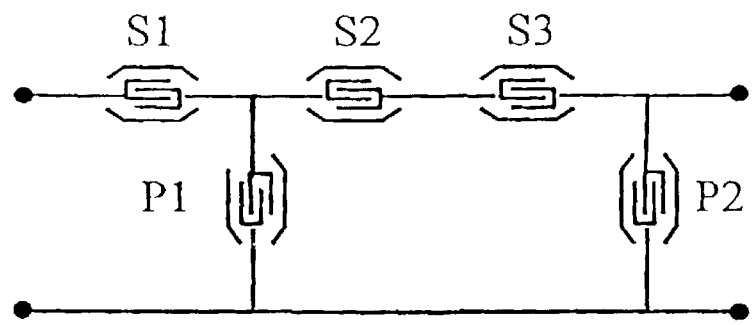
FIG. 7 is an equivalent circuit figure of SAW device of the example 3.

The filter obtained in this manner is, as shown in an equivalent circuit in FIG. 7, a ladder-type filter of the constitution having three normal one-pair-terminal surface acoustic wave resonators (SAW device) (S1, S2, S3) in a series arm and two normal one-pair-terminal surface acoustic wave resonators (SAW device) (P1, P2) in two parallel arms. In this connection, hereinafter, the surface acoustic wave resonator provided in the series arm is referred to as a series resonator and the surface acoustic wave resonators provided in the parallel arm is referred to as a parallel resonator. In the series resonator, an electrode period is 1.94 $\mu$m, an aperture length is 30 $\mu$m, the number of excitation electrode finger pairs was 165, and the number of reflection electrode finger pairs was 80. In the parallel resonator P1, an electrode period is 2.03 $\mu$m, an aperture length is 55 $\mu$m, the number of excitation electrode finger pairs was 100, and the number of reflection electrode finger pairs was 78. and the parallel resonator P2 is the same as the parallel resonator P1 except that the number of reflection electrode finger pairs was 39.

Figure 8:
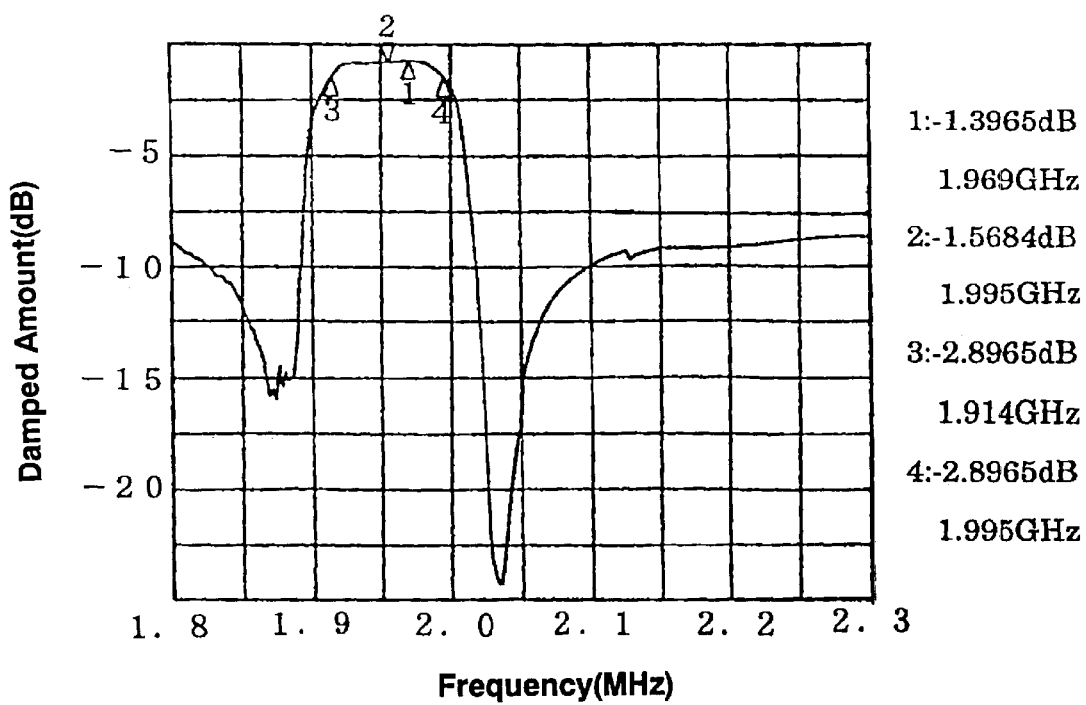
FIG. 8 is a graph showing a pass characteristic of SAW device of the example 3 of the present invention.

The obtained filter had electrodes of a good pattern with no residue and no aftercorrosion. Further, a pass characteristic of the filter will be shown in FIG. 8. This drawing shows that the filter had almost the same filter characteristic as is expected by a simulation and hence it is thought that the filter did not suffer from damage on the piezoelectric substrate by the etching.

Further, a filter was manufactured under the same conditions as above except that the RF power was held at 70 w and the gas pressure was 1 Pa at start and then was increased to 3 Pa during over-etching. The obtained filter had good electrodes as is the case with above filter and had almost the same pass characteristic as is expected by the simulation.

Comparative Example 1

An Al layer, an Al—2% Mg alloy layer, and an Al—4% Mg alloy layer were etched under the same conditions as the example 1, respectively, except that the etching conditions were changed as follows.

Etching conditions:

Etching gas; mixed gas comprising $BCl_3$ and $Cl_2$ (flow ratio =1:1)

Gas pressure; 5 Pa

RF power; 50 w

The layers were subjected to the post treatment as is the case with the example 1. In the case of the Al layer, a sharp electrode reflecting the shape of the mask could be obtained. In the case of the Al—2% Mg alloy layer, the etching proceeded to the last, but a lot of residues containing Mg, Cl, C, and O remained on the piezoelectric substrate and the aftercorrosion much appeared thereon. Further, in the case of the Al—4% Mg alloy layer, the etching proceeded to a thickness of about 150 nm but did not proceed further and the aftercorrosion much appeared.

EXAMPLE 4

An electrode was formed as is the case with the example 1 except that the content of Mg was varied from 0 to 5 weight %. The relationship between the content of Mg and the selectivity to the electrode and the resist of the obtained electrode will be shown in FIG. 9.

Further, electrodes were formed as is the case with the comparison 1 except that the content of Mg was varied from 0 to 5 weight %. The relationship between the content of Mg and the selectivity of the electrode and the resist of the obtained electrode will be shown also in FIG. 9.

Figure 9:
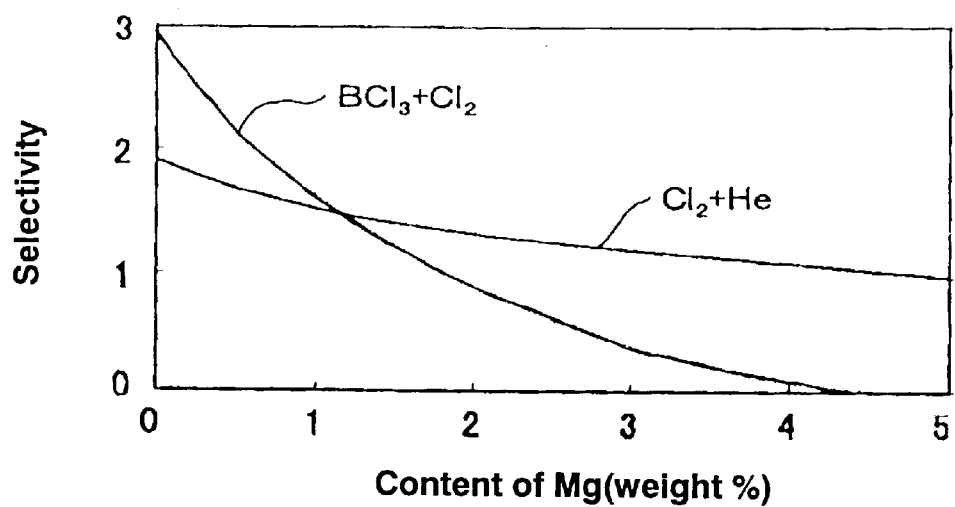
FIG. 9 is a graph showing a relationship between the content of Mg and the selectivity of the example 4 of the present invention.

It is evident from FIG. 9 that, according to the etching conditions in accordance with the present invention, even if the content of Mg increases, the selectivity can be kept.

Comparative Example 2

An Al—5% Cu alloy layer was etched under the same conditions as the example 1 except that the etching conditions were changed as follows.

Etching conditions:

Etching gas; mixed gas comprising $BCl_3$ and $Cl_2$, and He (flow ratio: $BCl_3+Cl_2$:He=1:9, the addition ratio of $BCl_3$ to $Cl_2$ was varied)

Gas pressure; 2 Pa

RF power; 100 w

Figure 10:
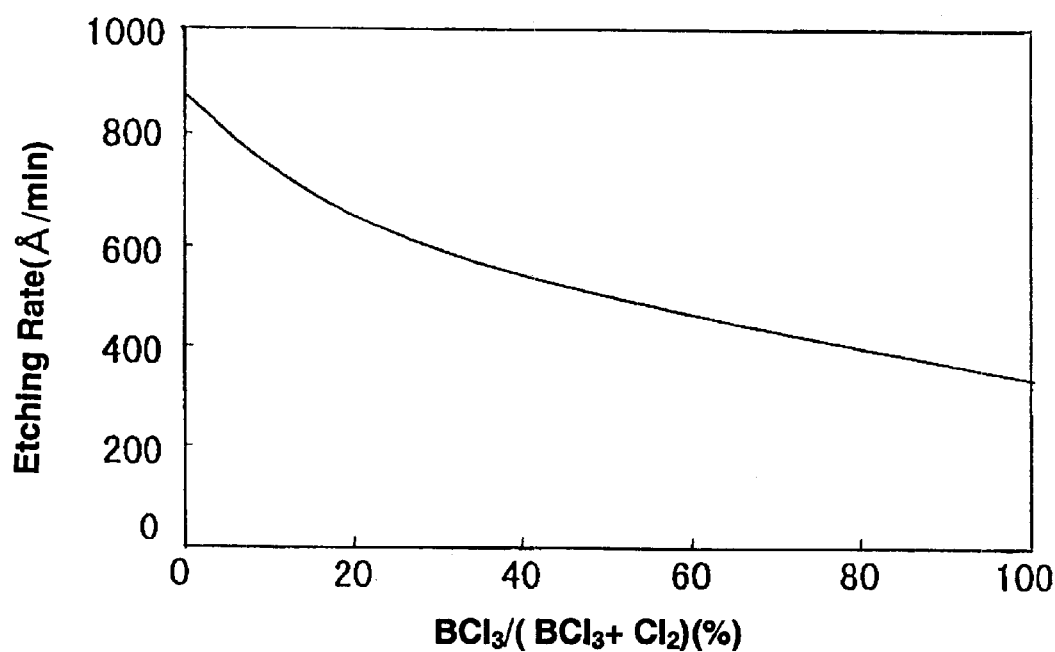
FIG. 10 is a graph showing a etching rate of the alloy layer to the addition ratio of $BCl_3$ and $Cl_2$ of the comparative example 2.

The layer was subjected to the post treatment as is the case with the example 1. The etching rate of the alloy layer to the addition ratio of $BCl_3$ and $Cl_2$ will be shown in FIG. 10. As is evident from FIG. 10, it was found that as the addition ratio of $BCl_3$ increased, the etching rate decreased, that is, the addition of $BCl_3$ produced a reverse effect.

According to the method of manufacturing the SAW device in accordance with the present invention, when an electrode having a high content of the other metal whose halide has a low vapor pressure and a high content of Al is formed by patterning by reactive ion etching, the etching can be realized which retards the generation of the aftercorrosion and prevent the substrate under the electrode from being pitted.

Since the SAW using the electrode having a high-power durability is easily manufactured by the manufacturing method in accordance with the present invention, the reliability of such a device as an antenna branching filter using the SAW device can be enhanced.

What is claimed is:

1. A method of manufacturing a surface acoustic device having an electrode containing Al and another metal comprising; forming and patterning a layer of Al and another metal forming the electrode by reactive ion etching which is conducted by using an etching gas containing a mixed gas comprising $Cl_2$ and He at a gas pressure of 0. 1 Pa to 3 Pa; wherein the mixed gas contains 70% or more of He by volume.

2. A method of manufacturing a surface acoustic device as claimed in claim 1, wherein the other metal includes Cu, Mg, or both of Cu and Mg.

3. A method of manufacturing a surface acoustic device as claimed in claim 1, wherein the other metal is one whose halide has a low vapor pressure.

4. A method of manufacturing a surface acoustic device as claimed in claim 2, wherein the electrode is a laminated body of a layer of Al or an Al alloy and a Mg layer.

5. A method of manufacturing a surface acoustic device as claimed in claim 1, wherein the content of the other metal in the electrode is 1 weight % or more.

6. A method of manufacturing a surface acoustic device as claimed in claim 1, wherein the electrode is formed on a piezoelectric substrate made of a single crystal of $LiNbO_3$, $LiTaO_3$, or $Li_2B_4O_7$.

7. A method of manufacturing a surface acoustic device as claimed in claim 1, wherein said layer for forming the electrode is subjected to an annealing treatment before it is patterned.

8. A method of manufacturing a surface acoustic device as claimed in claim 7, wherein the annealing treatment is performed at a temperature of 100 to 300° C.

9. A method of manufacturing a surface acoustic device as claimed in claim 1, wherein the reactive ion etching comprises two steps and the RF power of the latter etching step is not less than 50% to less than 100% of the RF power of the former etching step.

10. A method of manufacturing a surface acoustic device as claimed in claim 1, wherein the reactive ion etching comprises two steps and the gas pressure of the latter etching step is 1.5 to 3 times the gas pressure of the former etching step.

11. A method of manufacturing a surface acoustic device having an electrode containing an Al and an other metal comprising; forming and patterning a layer of Al and another metal forming the electrode by reactive ion etching which is conducted by using an etching gas containing a mixed gas comprising $Cl_2$ and He at a gas pressure of 0.1 Pa to 3 Pa;

wherein the total flow rate of the etching gas is 10 to 100 sccm.

* * * * *